United States Patent
Ikonomov et al.

(10) Patent No.: US 11,991,863 B2
(45) Date of Patent: May 21, 2024

(54) APPARATUS, SYSTEM, AND METHOD FOR MITIGATING DEFORMATION OF SPRING-LOADED HEATSINKS

(71) Applicant: Juniper Networks, Inc., Sunnyvale, CA (US)

(72) Inventors: Nikola Ikonomov, Sunnyvale, CA (US); Attila I. Aranyosi, Sunnyvale, CA (US); Sean Kim, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 194 days.

(21) Appl. No.: 17/532,633

(22) Filed: Nov. 22, 2021

(65) Prior Publication Data

US 2023/0164956 A1 May 25, 2023

(51) Int. Cl.
*H05K 7/20* (2006.01)
*G06F 1/20* (2006.01)

(52) U.S. Cl.
CPC ............ *H05K 7/2049* (2013.01); *G06F 1/20* (2013.01)

(58) Field of Classification Search
CPC . H05K 7/2049; G06F 1/20; H01L 2023/4043; H01L 2023/4087; H01L 23/4006
See application file for complete search history.

(56) References Cited

U.S. PATENT DOCUMENTS

| | | | |
|---|---|---|---|
| 6,212,074 B1 * | 4/2001 | Gonsalves | H01L 23/4275 174/16.3 |
| 6,545,879 B1 * | 4/2003 | Goodwin | H05K 7/1053 361/709 |
| 7,042,727 B2 * | 5/2006 | Ulen | H01L 23/4006 174/16.3 |
| 10,304,755 B1 * | 5/2019 | Yatskov | H01L 23/4006 |
| 10,440,812 B2 * | 10/2019 | He | H01L 23/433 |
| 2001/0055198 A1 * | 12/2001 | Park | H01L 23/4006 257/E23.084 |
| 2009/0083972 A1 * | 4/2009 | Colbert | H01L 23/4006 29/726 |
| 2013/0032324 A1 * | 2/2013 | Aldridge | H01L 23/4338 165/185 |
| 2014/0239488 A1 * | 8/2014 | Kobayashi | H01L 23/367 257/718 |
| 2015/0327353 A1 * | 11/2015 | Dickover | H01L 23/4338 29/890.03 |
| 2016/0360645 A1 * | 12/2016 | Achard | H05K 7/2039 |
| 2022/0230936 A1 * | 7/2022 | Zhong | H01L 25/0652 |

* cited by examiner

*Primary Examiner* — Stephen S Sul
(74) *Attorney, Agent, or Firm* — Greenberg Traurig, LLP (57) ABSTRACT

A disclosed apparatus may include (1) a heat-emitting component, (2) a heatsink that includes a designated area thermally coupled to the heat-emitting component, (3) a plurality of springs that apply forces that support the thermal coupling between the designated area of the heatsink and the heat-emitting component, and (4) a pressure plate that concentrates the forces applied by the springs toward the designated area of the heatsink. Various other apparatuses, systems, and methods are also disclosed.

19 Claims, 7 Drawing Sheets

APPARATUS, SYSTEM, AND METHOD FOR MITIGATING DEFORMATION OF SPRING-LOADED HEATSINKS

BACKGROUND

Heatsinks are often a critical factor for electronic and mechanical devices. For example, a telecommunications device (such as a router or switch) may include circuit boards with electronic components that generate heat during operation, thereby causing the operating temperatures of those electronic components and/or neighboring components to rise. If the operating temperatures rise above a certain level, such components may overheat, malfunction, or even break. To prevent such issues, many electronic components may be equipped with heatsinks designed to transfer and/or dissipate heat. The heatsinks may include thermally conductive material that transfers heat away from the electronic components, thereby cooling the electronic components and/or enabling them to achieve higher performance.

Heatsinks may also introduce certain risks into telecommunications devices. For example, a high-performing heatsink may be relatively heavy and/or represent a heavy load that is pressed against an electronic component via one or more springs. Unfortunately, the pressure applied to the heatsink by the springs may actually deform and/or bend the heatsink. Such deformation and/or bending of the heatsink may impair, degrade, and/or destroy the heatsink's performance (e.g., crashing a vapor chamber within the heatsink, demating the thermal coupling between the heatsink and the electronic component, and/or cracking the electronic component).

Similarly, the pressure applied to the heatsink by the springs may actually deform, crack, and/or other damage the electronic component. Such deformation and/or damage of the electronic component may impair, degrade, and/or destroy the electronic component's performance. The instant disclosure, therefore, identifies and addresses a need for additional and improved apparatuses, systems, and methods for mitigating deformation of spring-loaded heatsinks and/or damaging electronic components cooled by such heatsinks.

SUMMARY

As will be described in greater detail below, the instant disclosure generally relates to apparatuses, systems, and methods for mitigating deformation of spring-loaded heatsinks. In one example, an apparatus for accomplishing such a task may include (1) a heat-emitting component, (2) a heatsink that includes a designated area thermally coupled to the heat-emitting component, (3) a plurality of springs that apply forces that support the thermal coupling between the designated area of the heatsink and the heat-emitting component, and (4) a pressure plate that concentrates the forces applied by the springs toward the designated area of the heatsink.

Similarly, a system for accomplishing such a task may include (1) a computing device and (2) a spring-loaded heat exchanger incorporated in the computing device, wherein the spring-loaded heat exchanger comprising (A) a heat-emitting component, (B) a heatsink that includes a designated area thermally coupled to the heat-emitting component, (C) a plurality of springs that apply forces that support the thermal coupling between the designated area of the heatsink and the heat-emitting component, and (D) a pressure plate that concentrates the forces applied by the springs toward the designated area of the heatsink.

A corresponding method may include (1) thermally coupling, via a spring-loaded heat exchanger, a designated area of a heatsink to a heat-emitting component mounted to a circuit board, (2) applying, to the spring-loaded heat exchanger, a plurality of springs that impart forces to support the thermal coupling between the designated area of the heatsink and the heat-emitting component, and (3) applying, to the spring-loaded heat exchanger, a pressure plate that concentrates the forces imparted by the springs toward the designated area of the heatsink.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Throughout the drawings, identical reference characters and descriptions indicate similar, but not necessarily identical, elements. While the exemplary embodiments described herein are susceptible to various modifications and alternative forms, specific embodiments have been shown byway of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for mitigating deformation of spring-loaded heatsinks. As will be explained in greater detail below, embodiments of the instant disclosure may include and/or involve a pressure plate that concentrates forces applied by a plurality of springs toward a designated area of a heatsink. For example, a spring-loaded heatsink may include and/or involve springs coupled to mounting posts that maintain the heatsink in place atop a heat-emitting component. In this example, the spring-loaded heatsink may include and/or involve a pressure plate that concentrates and/or focuses forces applied by those springs toward a pedestal of the heatsink that makes contact with the heat-emitting component.

By concentrating and/or focusing the forces applied by those springs toward the pedestal, the pressure plate may safely align and/or transfer those forces to the pedestal pressing against the heat-emitting component, thereby preventing those forces from being distributed to portions of the heatsink that could potentially lead to deformation and/or bending of the heatsink or even damage to the heat-emitting component. As a result, the pressure plate may enable the spring-loaded heatsink to maintain a secure thermal coupling with the heat-emitting component, to improve or maximize the heatsink's performance, to prolong the structural integrity or thermal-transfer capabilities of the heatsink, and/or to protect the functionality of the heat-emitting component.

The following will provide, with reference to FIGS. 1-7, detailed descriptions of exemplary components, apparatuses, systems, configurations, and/or implementations for mitigating deformation of spring-loaded heatsinks. In addition, the discussion corresponding to FIG. 8 will provide detailed descriptions of an exemplary method for assembling and/or manufacturing apparatuses for mitigating deformation of spring-loaded heatsinks.

Figure 1:
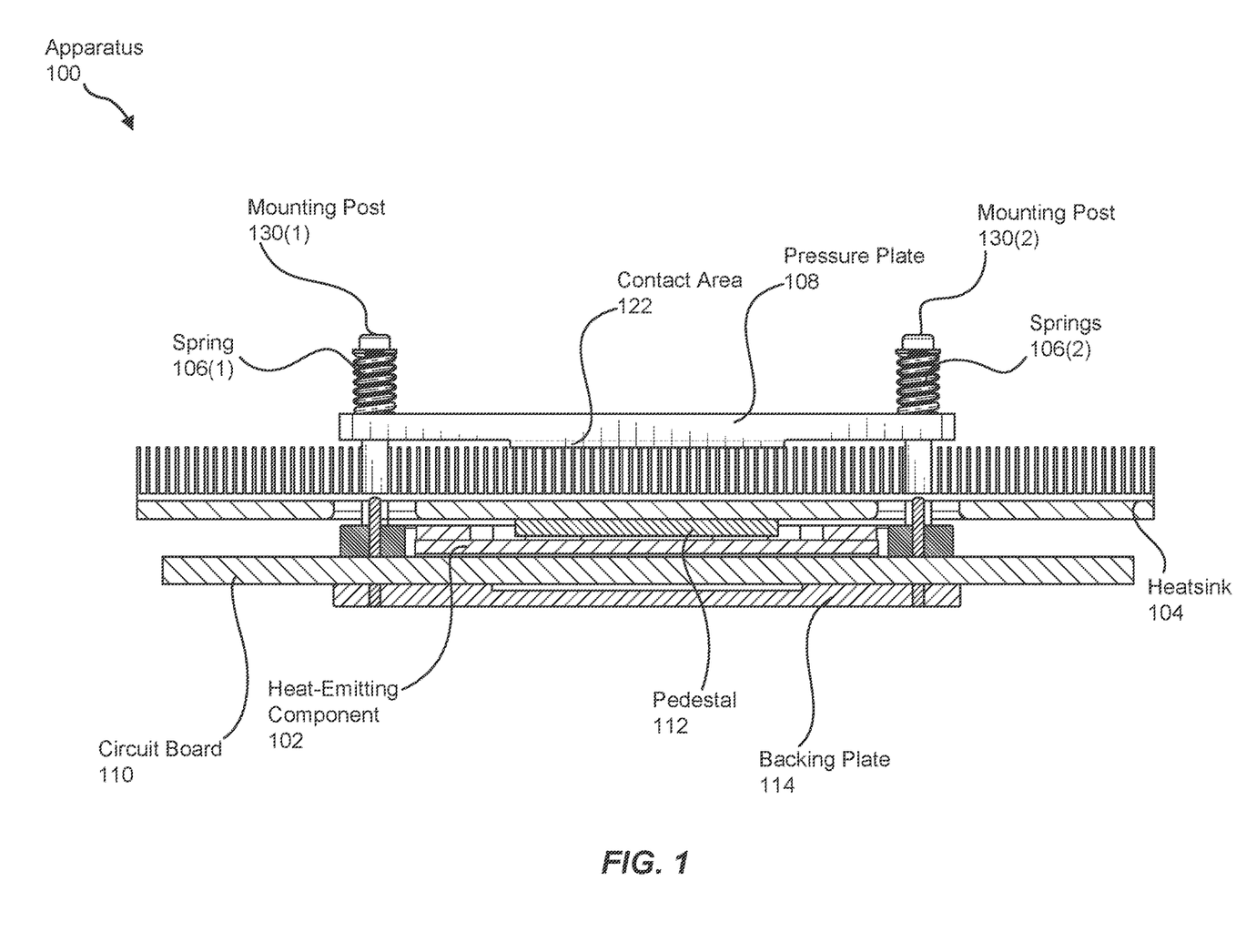
FIG. 1 is an illustration of an exemplary apparatus for mitigating deformation of spring-loaded heatsinks in accordance with one or more embodiments of this disclosure.

FIG. 1 illustrates an exemplary apparatus 100 for mitigating deformation of spring-loaded heatsinks. As illustrated in FIG. 1, exemplary apparatus 100 may include and/or represent various features, components, and/or devices that make up and/or form a spring-loaded heatsink. For example, apparatus 100 may include and/or represent a heatsink 104, springs 106(1) and 106(2), and a pressure plate 108. In this example, heatsink 104 may be spring-loaded by springs 106(1) and 106(2) to press against a heat-emitting component 102 coupled to a circuit board 110. Specifically, heatsink 104 may include and/or incorporate a designated area (e.g., a pedestal 112) that makes physical contact and/or interfaces with a top surface of heat-emitting component 102. Although FIG. 1 illustrates only two springs, apparatus 100 may also include and/or represent one or more additional springs that contribute to spring-loading heatsink 104 to press against heat-emitting component 102.

As further illustrated in FIG. 1, exemplary apparatus 100 may include and/or represent mounting posts 130(1) and 130(2) that maintain and/or hold heatsink 104 in place atop heat-emitting component 102 by way of pressure plate 108. Although FIG. 1 illustrates only two mounting posts, apparatus 100 may also include and/or represent one or more additional mounting posts that contribute to maintaining and/or holding heatsink 104 in place atop heat-emitting component 102 by way of pressure plate 108.

In some examples, mounting posts 130(1) and 130(2) may mate and/or interface with a backing plate 114 applied and/or positioned opposite circuit board 110 to pressurize and/or lock pressure plate 108 against heatsink 104 via springs 106(1) and 106(2). In these examples, springs 106(1) and 106(2) may be coupled to mounting posts 130(1) and 130(2), respectively, and apply forces that support the thermal coupling between the designated area (e.g., pedestal 112) of heatsink 104 and heat-emitting component 102. In one example, pressure plate 108 may concentrate and/or focus those forces applied by springs 106(1) and 106(2) toward the designated area of heatsink 104. By doing so, pressure plate 108 may safely align and/or transfer those forces to the designated area of heatsink 104 pressing against heat-emitting component 102, thereby preventing those forces from being distributed to portions of heatsink 104 that could potentially lead to deformation and/or bending of heatsink 104 or even damage to heat-emitting component 102.

In some examples, heatsink 104 may include and/or represent any type or form of device, structure, and/or mechanism designed to conduct, transfer, absorb, and/or sink heat. Heatsink 104 may include and/or contain a variety of thermally conductive materials. Examples of such thermally conductive materials include, without limitation, copper, aluminum, diamond, silver, gold, alloys of one or more of the same, combinations or variations of one or more of the same, and/or any other suitable materials.

In some examples, heatsink 104 may contain and/or be composed of a series of ridges or corrugations extending from a base. For example, heatsink 104 may include and/or incorporate a finned and/or pin fin configuration or design. This configuration may increase the surface area of the conductive material within the heatsink, thereby increasing the amount of heat dissipated by the same. Heatsink 104 may also include any additional or alternative structure designed to facilitate and/or increase heat dissipation, such as wicks, heatpipes, and/or vapor chambers.

In some examples, heatsink 104 may include and/or incorporate pedestal 112, which interfaces and/or makes contact with heat-emitting component 102. In one example, pedestal 112 may be dimensioned to substantially match the size of heat-emitting component 102. For example, pedestal 112 may be sized to cover the top surface of heat-emitting component 102, thereby providing an area sufficient to achieve the necessary thermal transfer. In this example, pedestal 112 may be positioned atop heat-emitting component 102 to form and/or establish a thermal coupling with heat-emitting component 102.

In some examples, springs 106(1) and 106(2) may each include and/or represent any type or form of mechanical apparatus and/or device capable of storing, absorbing, and/or releasing energy or force. In one example, spring 106(1) and 106(2) may each include and/or represent a compression coil spring. Additional examples of springs 106(1) and 106(2) include, without limitation, tension springs, extension springs, horseshoe springs, torsion springs, coil springs, constant-force springs, gas springs, combinations or variations of one or more of the same, and/or any other suitable springs.

Spring 106(1) and 106(2) may include and/or contain a variety of materials. Examples of such materials include, without limitation, metals, copper, aluminum, alloys, plastics, polymers, combinations or variations of one or more of the same, and/or any other suitable materials.

In some examples, pressure plate 108 may include and/or represent any type or form of physical structure and/or mechanism that pressurizes heatsink 104 to heat-emitting electrical component 102. In one example, pressure plate 108 may include and/or incorporate a contact area 122 that presses against and/or makes contact a top surface (e.g., a fin structure) of with heatsink 104. In this example, contact area 122 of pressure plate 108 may be positioned atop heatsink 104 opposite pedestal 112 of heatsink 104. By positioning pressure plate 108 atop heatsink 104 in this way, the boundary of contact area 122 may substantially align and/or coincide with the boundary of pedestal 112 of heatsink 104. In certain examples, pressure plate 108 may reside and/or sit between springs 106(1) and 106(2) applied to mounting posts 130(1) and 130(2) and heatsink 104. This position and/or configuration of pressure plate 108 may facilitate spring-loading pressure plate 108 toward the designated area of heatsink 104. Thus, pressure plate 108 may avoid making contact with heatsink 104 outside of contact area 122 to protect the structural integrity of heatsink 104(1).

In some examples, circuit board 110 may include and/or represents any piece of insulating material that facilitates mounting (e.g., mechanical support) and/or interconnection (e.g., electrical coupling) of electrical and/or electronic components. In one example, circuit board 110 may include and/or represent a Printed Circuit Board (PCB). Examples of circuit board 102 include, without limitation, single-sided boards, double-sided boards, multilayer boards, motherboards, linecards, backplanes, midplanes, and/or any other suitable type of circuit board. Various components (e.g., heat-emitting component 102) may be laminated, etched, attached, soldered, and/or otherwise coupled to circuit board 110.

In some examples, circuit board 110 may include various electrically conductive layers and/or traces (not necessarily illustrated in FIG. 1). Such conductive layers and/or traces may include and/or represent electrically conductive materials. Examples of such electrically conductive materials include, without limitation, copper, aluminum, silver, gold, alloys of one or more of the same, combinations or variations of one or more of the same, and/or any other suitable materials.

In one example, each layer may include and/or represent a conductive plane that is etched and/or laid during the fabrication phase to produce various conductive traces throughout circuit board 110. In this example, the etched and/or laid conductive traces may be separated from and/or interconnected with one another as necessary to form one or more circuits that incorporate electrical components and/or electronics across circuit board 110.

In some examples, backing plate 114 may include and/or represent include and/or represent any type or form of physical structure and/or mechanism that pressurizes heatsink 104 to heat-emitting electrical component 102. In one example, backing plate 114 may provide support and/or additional structure to the spring-loaded heatsink. In one example, heatsink 104 may be applied to the top side of circuit board 110 in FIG. 1 to facilitate contact with heat-emitting component 102, and backing plate 114 may be applied to the bottom side of circuit board 110 in FIG. 1. In this example, backing plate 114 and/or pressure plate 108 may be secured in place by mounting posts 130(1) and 130(2).

In some examples, mounting posts 130(1) and 130(2) may each include and/or represent any type or form of attachment, mounting, and/or coupling structure or means. For example, mounting posts 130(1) and 130(2) may each include and/or represent a pairing of a screw and threaded post or standoff. In another example, mounting posts 130(1) and 130(2) may each include and/or represent a pairing of a pin and an extension post or bracket.

Mounting posts 130(1) and 130(2) may include and/or contain a variety of materials. Examples of such materials include, without limitation, metals, copper, aluminum, alloys, plastics, polymers, combinations or variations of one or more of the same, and/or any other suitable materials.

Figure 2:
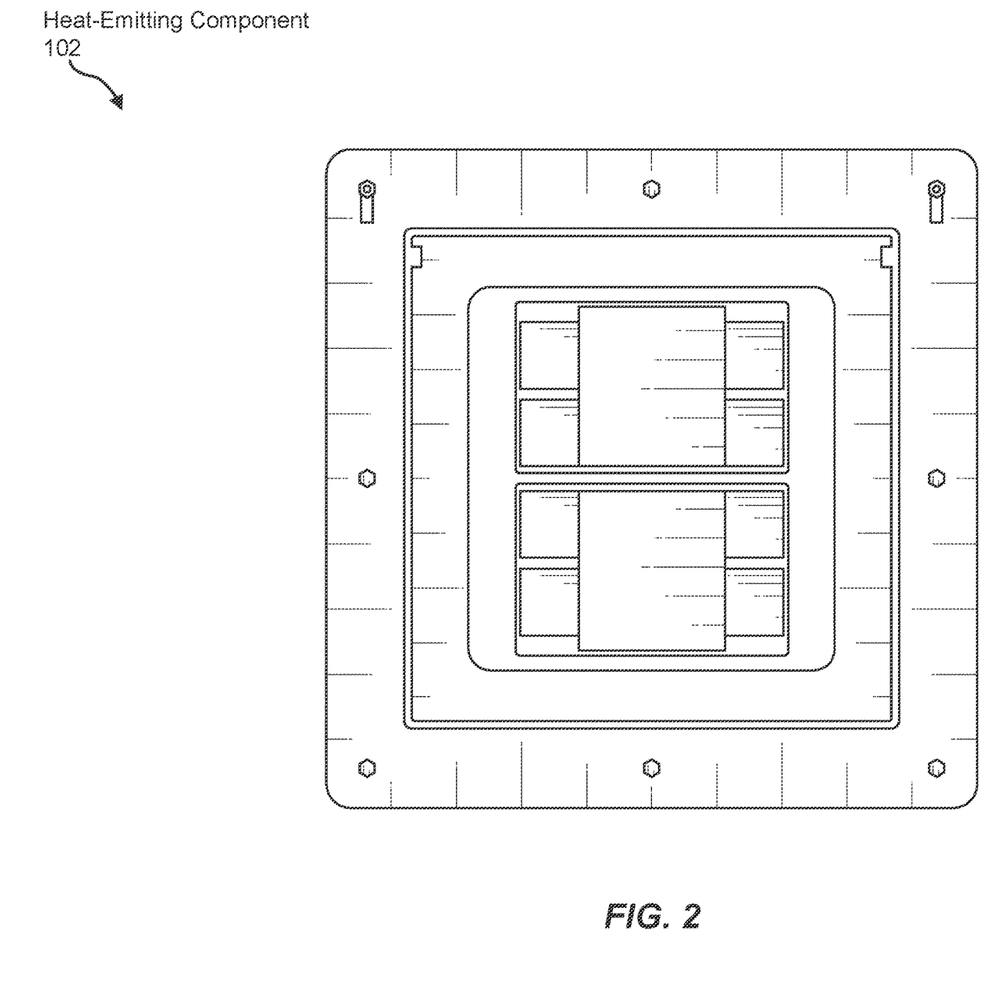
FIG. 2 is an illustration of an exemplary heat-emitting component capable of being cooled by a spring-loaded heatsink in accordance with one or more embodiments of this disclosure.

FIG. 2 illustrates an exemplary implementation of heat-emitting component 102, which is capable of being cooled by a spring-loaded heatsink. In some examples, heat-emitting component 102 may include and/or represent any type or form of device, component, and/or circuit that emits heat. In one example, heat-emitting component 102 may include and/or represent an integrated circuit. Additional examples of heat-emitting component 102 include, without limitation, Central Processing Units (CPUs), microprocessors, microcontrollers, Field-Programmable Gate Arrays (FPGAs) that implement softcore processors, Application-Specific Integrated Circuits (ASICs), memories (e.g., high-bandwidth memory devices), portions of one or more of the same, variations or combinations of one or more of the same, and/or any other suitable heat-emitting component.

Figure 3:
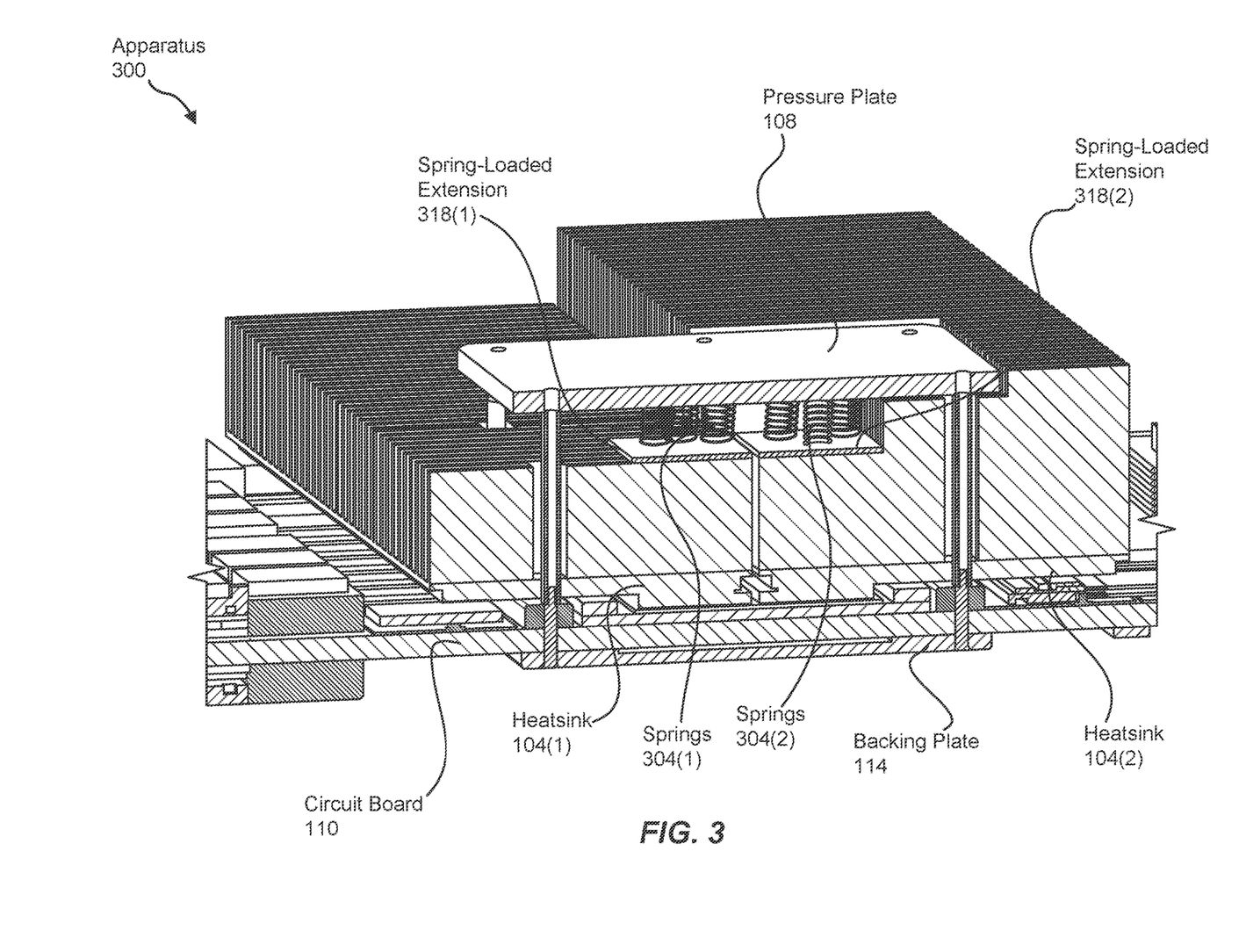
FIG. 3 is an illustration of an exemplary apparatus for mitigating deformation of spring-loaded heatsinks in accordance with one or more embodiments of this disclosure.

FIG. 3 illustrates an exemplary apparatus 300 for mitigating deformation of spring-loaded heatsinks. As illustrated in FIG. 3, exemplary apparatus 300 may include and/or represent various features, components, and/or devices that make up and/or form a spring-loaded heatsink assembly. In some examples, apparatus 300 may include and/or represent any of the features, components, and/or devices described above in connection with apparatus 100 in FIG. 1.

In some examples, apparatus 300 may include and/or represent a heatsink 104(1) and a heatsink 104(2), springs 304(1) and springs 304(2), and pressure plate 108. In this example, heatsink 104(1) may be spring-loaded by springs 304(1) to press against a heat-emitting component coupled to circuit board 110. In addition, heatsink 104(2) may be spring-loaded by springs 304(2) to press against an additional heat-emitting component coupled to circuit board 110. In one example, mounting posts may secure pressure plate 108 to backing plate 114, which is applied and/or positioned opposite circuit board 110 to pressurize and/or lock pressure plate 108 against heatsinks 104(1) and 104(2) via springs 304(1) and 304(2), respectively.

In some examples, pressure plate 108 may include and/or represent spring-loaded extensions 318(1) and 318(2) that concentrate forces applied by springs 304(1) and 304(2) toward designated areas (e.g., pedestals) of heatsinks 104(1) and 104(2), respectively. For example, spring-loaded extension 318(1) may include and/or incorporate springs 304(1) that press and/or extend another surface and/or platform from pressure plate 108. In this example, the extensible surface and/or platform may constitute and/or represent a contact area positioned atop heatsink 104(1) opposite the pedestal of heatsink 104(1). By positioning the contact area atop heatsink 104(1) in this way, the boundary of the contact area may substantially align with the boundary of the pedestal of heatsink 104(1). Thus, pressure plate 108 may avoid making contact with heatsink 104(1) outside of the contact area to protect the structural integrity of heatsink 104(1).

As another example, spring-loaded extension 318(2) may include and/or incorporate springs 304(2) that press and/or extend another surface and/or platform from pressure plate 108. In this example, the extensible surface and/or platform may constitute and/or represent another contact area positioned atop heatsink 104(2) opposite the pedestal of heatsink 104(2). By positioning the other contact area atop heatsink 104(2) in this way, the boundary of the other contact area may substantially align with the boundary of the pedestal of heatsink 104(2). Thus, pressure plate 108 may avoid making contact with heatsink 104(2) outside of the contact area to protect the structural integrity of heatsink 104(2).

Figure 4:
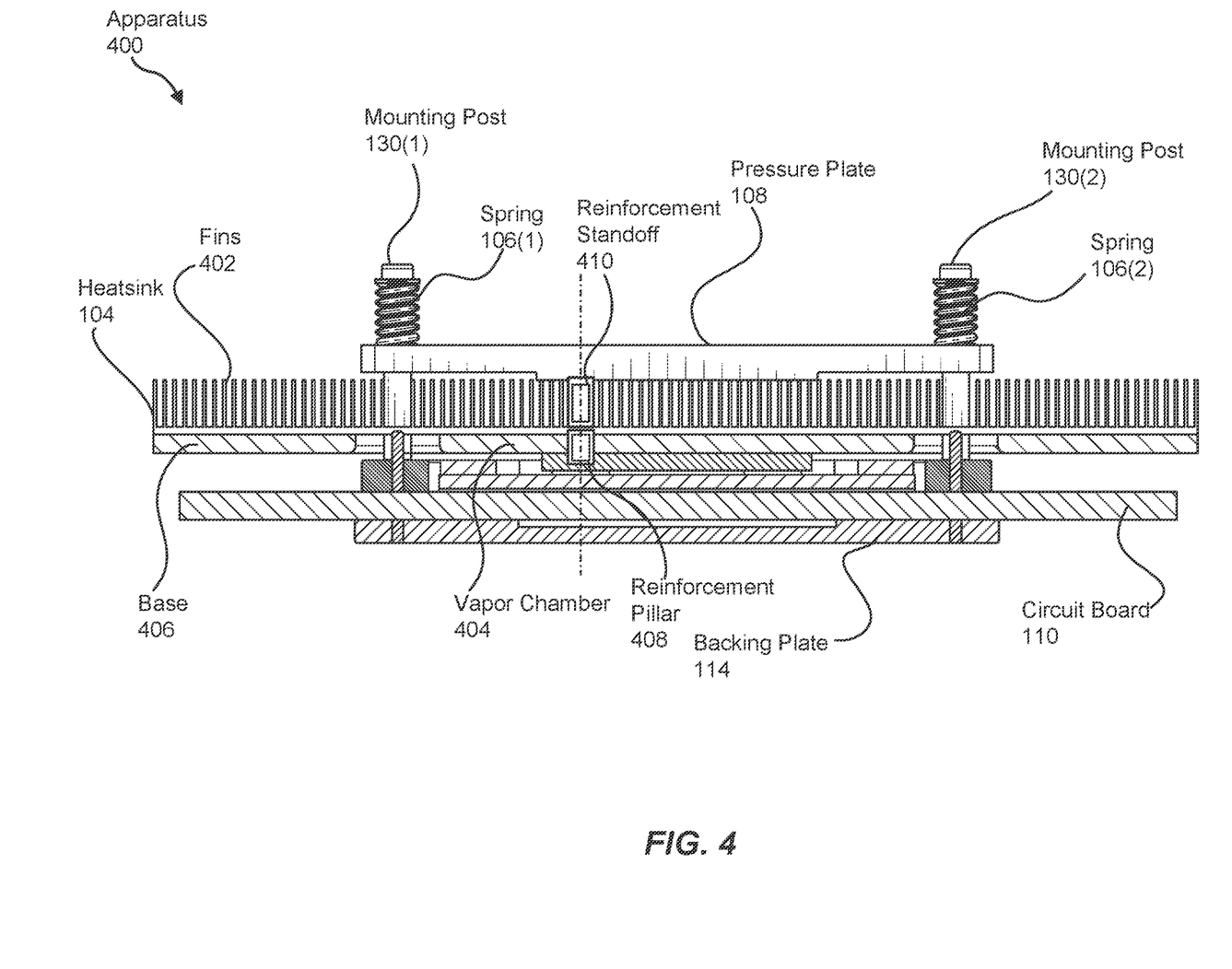
FIG. 4 is an illustration of an exemplary apparatus for mitigating deformation of spring-loaded heatsinks in accordance with one or more embodiments of this disclosure.

FIG. 4 illustrates an exemplary apparatus 400 for mitigating deformation of spring-loaded heatsinks. As illustrated in FIG. 4, exemplary apparatus 400 may include and/or represent various features, components, and/or devices that make up and/or form a spring-loaded heatsink. For example, apparatus 400 may include and/or represent heatsink 104, springs 106(1) and 106(2), and pressure plate 108. In some examples, apparatus 400 may include and/or represent any of the features, components, and/or devices described above in connection with apparatus 100 in FIG. 1 and/or apparatus 300 in FIG. 3.

In some examples, heatsink 104 may include and/or represent a base 406. In one example, base 406 of heatsink 104 may include and/or incorporate a vapor chamber 404. Additionally or alternatively, heatsink 104 may include and/or represent a plurality of fins 402 coupled to base 406.

In some examples, heatsink 104 may include and/or represent a reinforcement pillar 408 that extends, runs, and/or spans across at least one portion of vapor chamber 404. In one example, reinforcement pillar 408 may strengthen and/or improve the structural integrity of base 406 to withstand the pressure and/or compression applied by springs 106(1) and 106(2) without collapsing and/or breaking down. Additionally or alternatively, heatsink 104 may include and/or represent a reinforcement standoff 410 that extends, runs, and/or spans at least the length of fins 402 (or slightly higher) from base 406. In certain examples, reinforcement standoff 410 may strengthen and/or improve the structural integrity of fins 402 to withstand the pressure applied by springs 106(1) and 106(2) without collapsing and/or breaking down. For example, pressure plate 108 may make direct contact with reinforcement standoff 410 instead of fins 402. By doing so, pressure plate 108 may concentrate the forces applied by springs 106(1) and 106(2) toward the designated area of heatsink 104 via reinforcement standoff 410 without applying too much pressure fins 402 or risking damage to fins 402.

Reinforcement pillar 408 and/or reinforcement standoff 410 may include and/or contain a variety of materials. Examples of such materials include, without limitation, metals, steels, copper, aluminum, alloys, plastics, polymers, combinations or variations of one or more of the same, and/or any other suitable materials.

Figure 5:
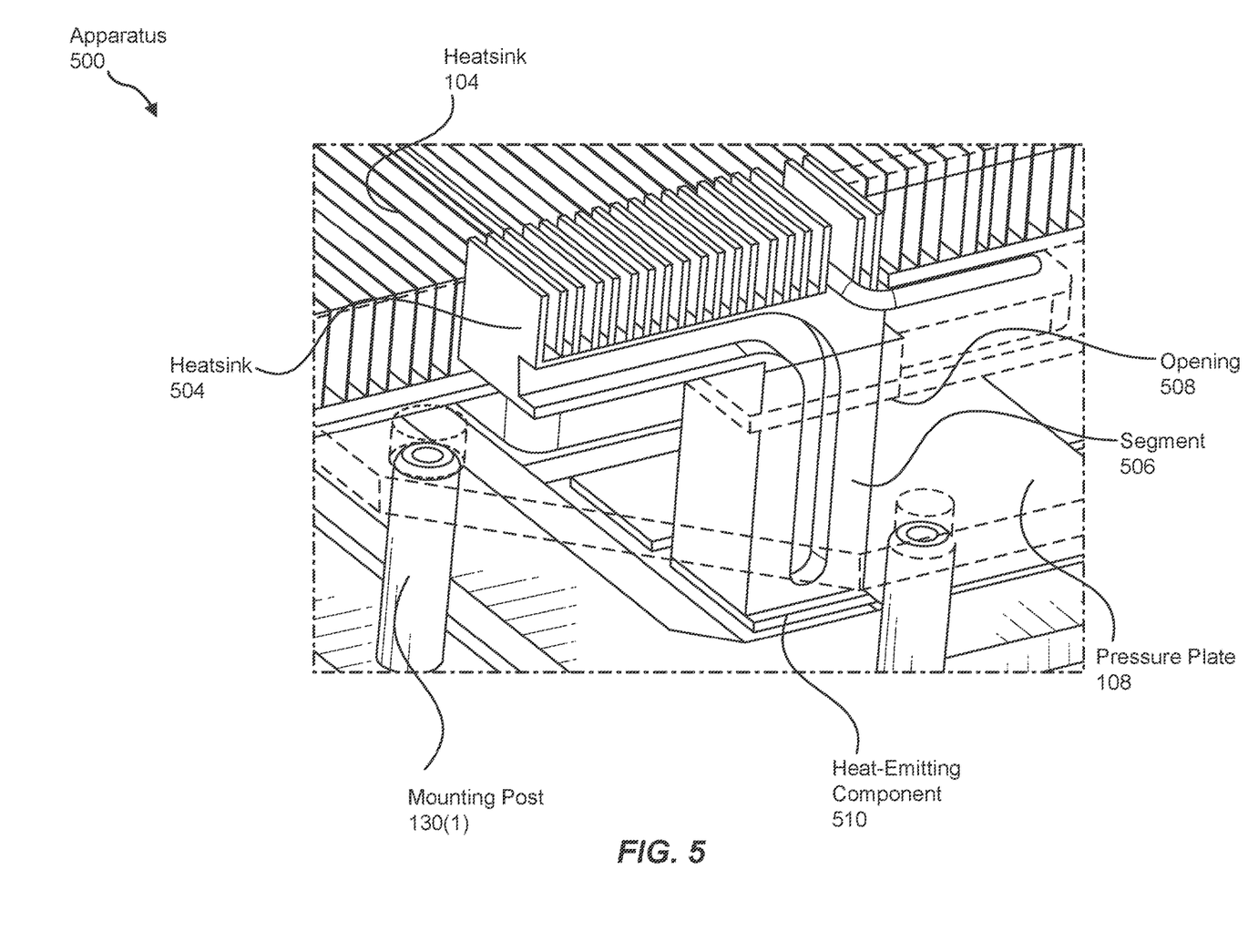
FIG. 5 is an illustration of an exemplary apparatus for mitigating deformation of spring-loaded heatsinks in accordance with one or more embodiments of this disclosure.

FIG. 5 illustrates an exemplary apparatus 500 for mitigating deformation of spring-loaded heatsinks. As illustrated in FIG. 5, exemplary apparatus 500 may include and/or represent various features, components, and/or devices that make up and/or form a spring-loaded heatsink. For example, apparatus 500 may include and/or represent heatsink 104, springs 106(1) and 106(2), and pressure plate 108. In some examples, apparatus 500 may include and/or represent any of the features, components, and/or devices described above in connection with apparatus 100 in FIG. 1, apparatus 300 in FIG. 3, and/or apparatus 400 in FIG. 4.

In some examples, pressure plate 108 may include and/or form an opening 508 fitted to accommodate a heatsink 504. For example, heatsink 504 may include and/or represent a segment 506 that passes through opening 504 of pressure plate 108 to make contact with a heat-emitting component 510. In this example, by making such contact, segment 506 may thermally couple heatsink 504 to heat-emitting component 510.

In some examples, heatsinks 104 and 504 may be thermally isolated from one another. Thus, heatsinks 104 and 504 may essentially constitute and/or form a split heatsink assembly. The thermal isolation between heatsinks 104 and 504 may accommodate, support, and/or facilitate the individual cooling needs and/or temperature regulation of heat-emitting components 102 and 510.

Figure 6:
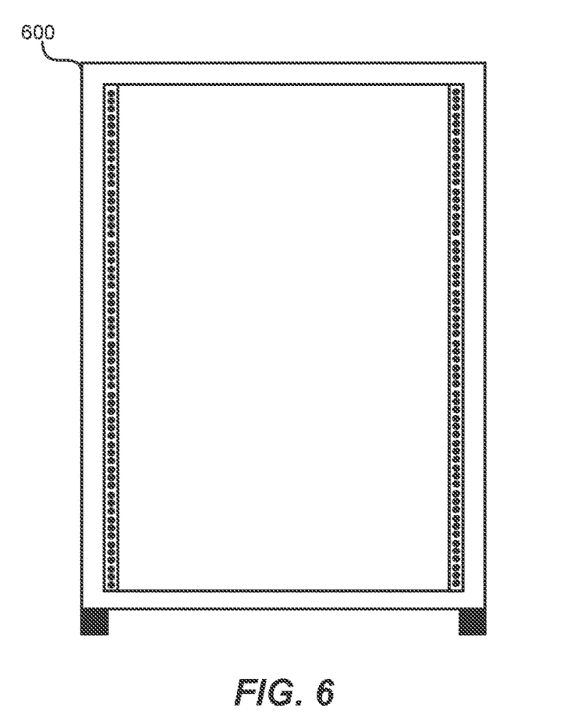
FIG. 6 is an illustration of an exemplary device rack that holds rackmount computing devices in accordance with one or more embodiments of this disclosure.

FIG. 6 illustrates an exemplary network rack 600 that houses and/or holds rackmount network devices. As illustrated in FIG. 6, network rack 600 may include various holes for mounting rackmount network devices. In this example, network rack 600 may house and/or maintain rackmount network devices of various sizes. These sizes may be represented in rack units (such as 1U, 2U, 3U, 4U, 5U, etc.).

Figure 7:
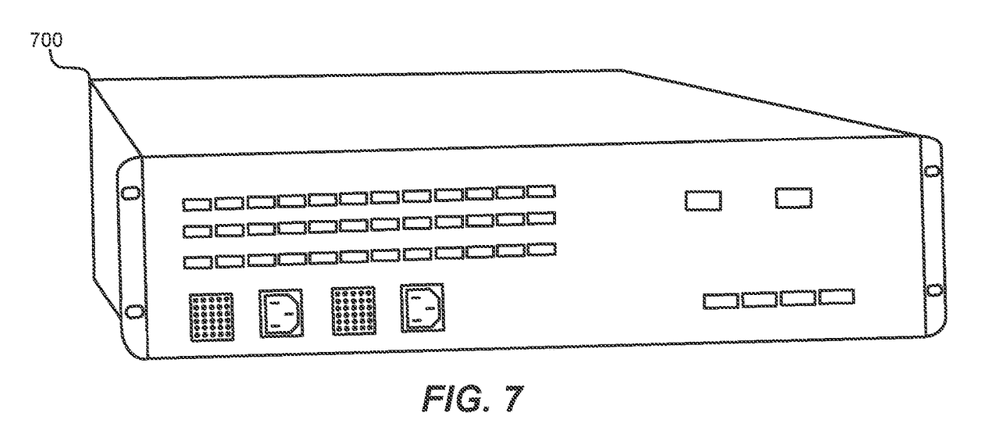
FIG. 7 is an illustration of an exemplary rackmount computing device in accordance with one or more embodiments of this disclosure.

FIG. 7 illustrates an exemplary rackmount computing device 700 that fits within network rack 600 in FIG. 6. As illustrated in FIG. 7, rackmount computing device 700 may be configured to fit within network rack 600 in FIG. 6. Accordingly, rackmount computing device 700 may be housed by network rack 600. In this example, rackmount computing device 700 may represent a rackmount switch or router. Rackmount computing device 700 may house and/or incorporate all or portions of apparatuses 100, 300, 400, and 500. In other words, rackmount computing device 700 may contain all the spring-loaded heatsink assemblies and/or corresponding components included in any one of those apparatuses.

Figure 8:
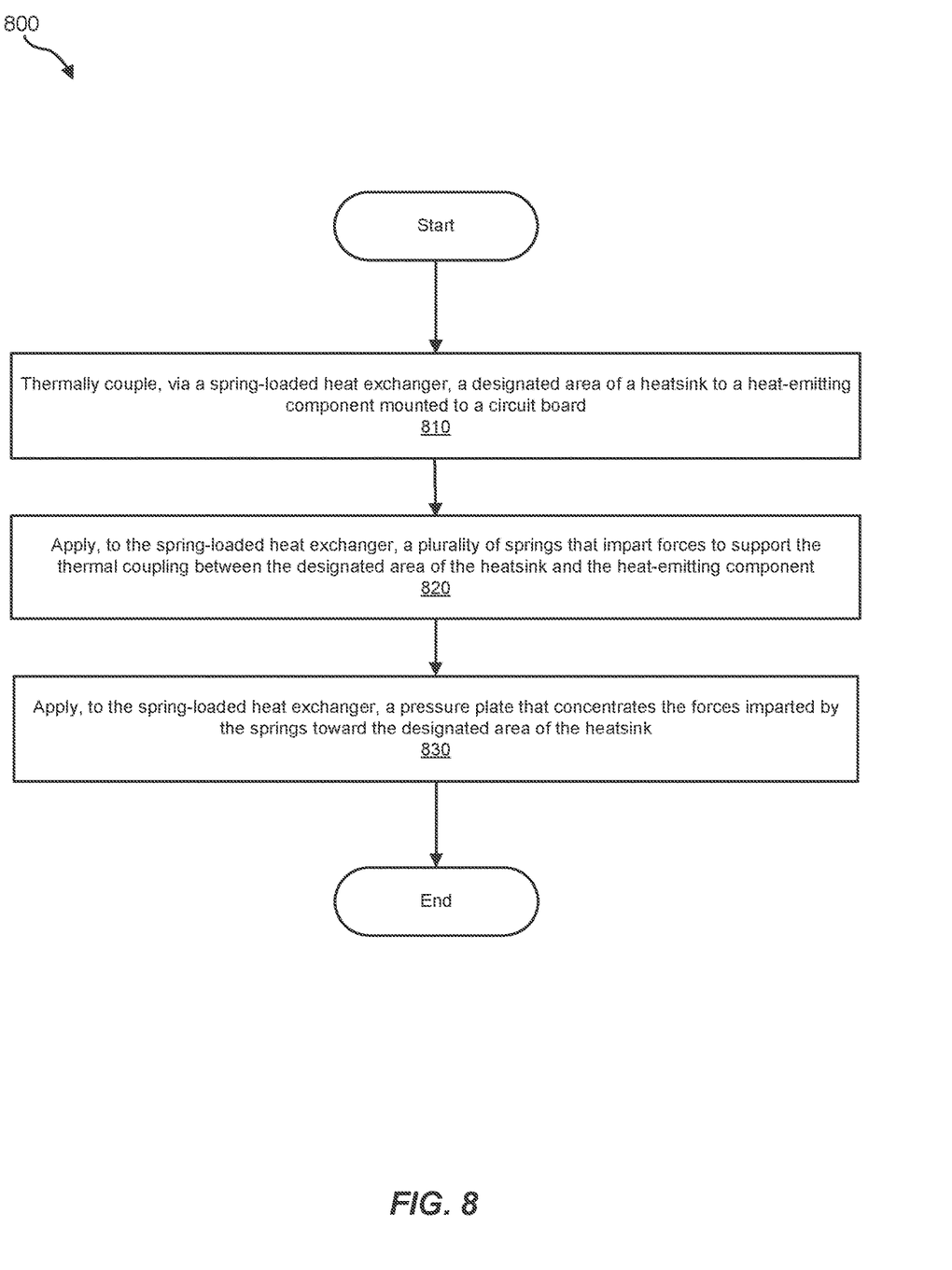
FIG. 8 is a flow diagram of an exemplary method for mitigating deformation of spring-loaded heatsinks in accordance with one or more embodiments of this disclosure.

FIG. 8 is a flow diagram of an exemplary method 800 for assembling and/or manufacturing an apparatus for mitigating deformation of spring-loaded heatsinks. Method 800 may include the step of thermally coupling, via a spring-loaded heat exchanger, a designated area of a heatsink to a heat-emitting component mounted to a circuit board (810). Step 810 may be performed in a variety of ways, including any of those described above in connection with FIGS. 1-7. For example, a computing equipment manufacturer or subcontractor may thermally couple, via a spring-loaded heat exchanger, a designated area of a heatsink to a heat-emitting component mounted to a circuit board.

Method 800 may also include the step of applying, to the spring-loaded heat exchanger, a plurality of springs that impart forces to support the thermal coupling between the designated area of the heatsink and the heat-emitting component (820). Step 820 may be performed in a variety of ways, including any of those described above in connection with FIGS. 1-7. For example, a computing equipment manufacturer or subcontractor may apply, to the spring-loaded heat exchanger, a plurality of springs that impart forces to support the thermal coupling between the designated area of the heatsink and the heat-emitting component.

Method 800 may further include the step of applying, to the spring-loaded heat exchanger, a pressure plate that concentrates the forces imparted by the springs toward the designated area of the heatsink (830). Step 830 may be performed in a variety of ways, including any of those described above in connection with FIGS. 1-7. For example, a computing equipment manufacturer or subcontractor may apply, to the spring-loaded heat exchanger, a pressure plate that concentrates the forces imparted by the springs toward the designated area of the heatsink.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
   a heat-emitting component coupled to a circuit board;
   a heatsink that includes:
      a base;
      at least one reinforcement standoff coupled to the base; and
      a designated area physically coupled to the heat-emitting component;
   a plurality of springs that apply forces that support the physical coupling between the designated area of the heatsink and the heat-emitting component;
   a pressure plate that is coupled between the heatsink and the plurality of springs and makes direct contact with the at least one reinforcement standoff and concentrates the forces applied by the plurality of springs toward the designated area of the heatsink via the at least one reinforcement standoff; and
   a backing plate that is applied opposite the pressure plate relative to the circuit board and is secured to the pressure plate via a plurality of mounting posts.

2. The apparatus of claim 1, wherein the designated area of the heatsink comprises a pedestal that:
   makes contact with the heat-emitting component; and
   is dimensioned to substantially match a size of the heat-emitting component.

3. The apparatus of claim 2, wherein:
   the pressure plate comprises a contact area that:
      is positioned atop the heatsink opposite the pedestal of the heatsink; and
   the pedestal of the heatsink comprises a boundary that substantially aligns with a boundary of the contact area of the pressure plate.

4. The apparatus of claim 1, wherein the plurality of springs are applied to the plurality of mounting posts that maintain the heatsink in place atop the heat-emitting component.

5. The apparatus of claim 1, wherein the pressure plate resides between the plurality of springs applied to the plurality of mounting posts and the heatsink to spring-load the pressure plate toward the designated area of the heatsink.

6. The apparatus of claim 1, wherein the pressure plate comprises a spring-loaded extension that concentrates the forces applied by the plurality of springs toward the designated area of the heatsink, wherein the spring-loaded extension of the pressure plate incorporates the plurality of springs.

7. The apparatus of claim 6, further comprising:
   an additional heat-emitting component;
   an additional heatsink that includes a designated area thermally coupled to the additional heat-emitting component; and
   a plurality of additional springs that apply forces that support the thermal coupling between the designated area of the additional heatsink and the additional heat-emitting component; and
   wherein the pressure plate further comprises an additional spring-loaded extension that concentrates the forces applied by the plurality of additional springs toward the designated area of the additional heatsink, wherein the additional spring-loaded extension of the pressure plate incorporates the plurality of additional springs.

8. The apparatus of claim 1, wherein the plurality of springs comprises a set of compression coil springs.

9. The apparatus of claim 1, wherein the heatsink comprises at least one of:
   a plurality of fins; and
   a vapor chamber.

10. The apparatus of claim 1, wherein the heatsink comprises:
    a vapor chamber incorporated in the base;
    a plurality of fins coupled to the base; and
    at least one reinforcement pillar that extends across at least one portion of the vapor chamber, wherein the at least one reinforcement standoff extends at least a length of the plurality of fins from the base.

11. The apparatus of claim 1, wherein the pressure plate forms an opening; and
    further comprising:
       an additional heat-emitting component; and
       an additional heatsink that includes a segment that passes through the opening of the pressure plate to thermally couple the additional heatsink to the additional heat-emitting component.

12. A system comprising:
    a computing device; and
    a spring-loaded heat exchanger incorporated in the computing device, wherein the spring-loaded heat exchanger comprising:
       a heat-emitting component coupled to a circuit board;
       a heatsink that includes:
          a base;
          at least one reinforcement standoff coupled to the base; and
          a designated area physically coupled to the heat-emitting component;
       a plurality of springs that apply forces that support the physical coupling between the designated area of the heatsink and the heat-emitting component;
       a pressure plate that is coupled between the heatsink and the plurality of springs and makes direct contact with the at least one reinforcement standoff and concentrates the forces applied by the plurality of springs toward the designated area of the heatsink via the at least one reinforcement standoff; and a backing plate that is applied opposite the pressure plate relative to the circuit board and is secured to the pressure plate via a plurality of mounting posts.

13. The system of claim 12, wherein the designated area of the heatsink comprises a pedestal that:
    makes contact with the heat-emitting component; and
    is dimensioned to substantially match a size of the heat-emitting component.

14. The system of claim 13, wherein:
    the pressure plate comprises a contact area that:
        is positioned atop the heatsink opposite the pedestal of the heatsink; and
    the pedestal of the heatsink comprises a boundary that substantially aligns with a boundary of the contact area of the pressure plate.

15. The system of claim 12, wherein the plurality of springs are applied to the plurality of mounting posts that maintain the heatsink in place atop the heat-emitting component.

16. The system of claim 12, wherein the pressure plate resides between the plurality of springs applied to the plurality of mounting posts and the heatsink to spring-load the pressure plate toward the designated area of the heatsink.

17. The system of claim 12, wherein the pressure plate comprises a spring-loaded extension that concentrates the forces applied by the plurality of springs toward the designated area of the heatsink, wherein the spring-loaded extension of the pressure plate incorporates the plurality of springs.

18. The system of claim 17, wherein the spring-loaded heat exchanger further comprising:
    an additional heat-emitting component;
    an additional heatsink that includes a designated area thermally coupled to the additional heat-emitting component; and
    a plurality of additional springs that apply forces that support the thermal coupling between the designated area of the additional heatsink and the additional heat-emitting component; and
    wherein the pressure plate further comprises an additional spring-loaded extension that concentrates the forces applied by the plurality of additional springs toward the designated area of the additional heatsink, wherein the additional spring-loaded extension of the pressure plate incorporates the plurality of additional springs.

19. A method comprising:
    physically coupling, via a spring-loaded heat exchanger, a designated area of a heatsink to a heat-emitting component mounted to a circuit board, wherein the heatsink includes a base and at least one reinforcement standoff coupled to the base;
    applying, to the spring-loaded heat exchanger, a plurality of springs that impart forces to support the physical coupling between the designated area of the heatsink and the heat-emitting component;
    applying, to the spring-loaded heat exchanger, a pressure plate that is coupled between the heatsink and the plurality of springs and makes direct contact with the at least one reinforcement standoff and concentrates the forces imparted by the plurality of springs toward the designated area of the heatsink via the at least one reinforcement standoff;
    applying a backing plate opposite the pressure plate relative to the circuit board; and
    securing the pressure plate to the backing plate via a plurality of mounting posts.

* * * * *